United States Patent
Zanetta et al.

(10) Patent No.: US 9,964,975 B1
(45) Date of Patent: May 8, 2018

(54) SEMICONDUCTOR DEVICES FOR SENSING VOLTAGES

(71) Applicant: NXP USA, Inc., Austin, TX (US)

(72) Inventors: Pedro Barbosa Zanetta, Campinas (BR); Andre Luis Vilas Boas, Amparo (BR)

(73) Assignee: NXP USA, Inc., Austin, TX (US)

( * ) Notice: Subject to any disclaimer, the term of this patent is extended or adjusted under 35 U.S.C. 154(b) by 0 days. days.

(21) Appl. No.: 15/720,318

(22) Filed: Sep. 29, 2017

(51) Int. Cl.
| | |
|---|---|
| G05F 1/56 | (2006.01) |
| H02M 3/07 | (2006.01) |
| G05F 1/569 | (2006.01) |
| G05F 1/46 | (2006.01) |
| G05F 1/565 | (2006.01) |
| G01R 19/00 | (2006.01) |
| G05F 3/16 | (2006.01) |

(52) U.S. Cl.
CPC ......... G05F 1/569 (2013.01); G01R 19/0023 (2013.01); G05F 1/468 (2013.01); G05F 1/562 (2013.01); G05F 1/565 (2013.01); G05F 3/16 (2013.01); H02M 3/07 (2013.01)

(58) Field of Classification Search
CPC ............ G05F 1/468; G05F 3/16; H02M 3/07; H02M 2003/071
See application file for complete search history.

(56) References Cited

U.S. PATENT DOCUMENTS

| | | | | | |
|---|---|---|---|---|---|
| 3,925,718 | A | * | 12/1975 | Wittlinger | G05F 3/267 323/315 |
| 4,103,249 | A | * | 7/1978 | Burdick | G05F 3/265 323/315 |
| 4,362,985 | A | * | 12/1982 | Tsuchiya | G05F 3/265 323/314 |
| 5,144,223 | A | * | 9/1992 | Gillingham | G05F 3/30 323/281 |
| 5,446,368 | A | * | 8/1995 | Uscategui | G05F 3/262 323/315 |
| 5,485,074 | A | * | 1/1996 | Tomasini | G05F 3/26 323/312 |
| 5,670,907 | A | * | 9/1997 | Gorecki | G05F 3/205 323/313 |
| 5,838,188 | A | * | 11/1998 | Taguchi | G05F 3/262 323/313 |
| 5,982,201 | A | * | 11/1999 | Brokaw | H03F 3/345 323/312 |

(Continued)

Primary Examiner — Yusef A Ahmed

(57) ABSTRACT

A circuit includes a first resistive element having a first terminal coupled to an input node to receive a negative voltage, a second resistive element having a first terminal coupled to a first power supply terminal, and a third resistive element having a first terminal coupled to the first power supply terminal. A first current mirror includes a first transistor coupled to a second terminal of the second resistive element and a second transistor coupled to a second terminal of the third resistive element and the first transistor, wherein the output node corresponds to the second terminal of the third resistive element. A second current mirror includes a third transistor coupled to the first transistor and a fourth transistor coupled to the second transistor, third transistor, and a second terminal of the first resistive element. The circuit converts the negative voltage to the positive proportion voltage.

20 Claims, 6 Drawing Sheets

(56) References Cited

U.S. PATENT DOCUMENTS

| | | | | |
|---|---|---|---|---|
| 6,084,391 A | * | 7/2000 | Onodera | G05F 3/242 |
| | | | | 323/313 |
| 6,903,599 B2 | | 6/2005 | Chen et al. | |
| 6,963,191 B1 | * | 11/2005 | McCalmont | G05F 3/262 |
| | | | | 323/315 |
| 7,362,163 B1 | | 4/2008 | Raghavan | |
| 7,701,281 B1 | | 4/2010 | Raghavan | |
| 8,830,776 B1 | | 9/2014 | Choy et al. | |
| 9,250,271 B2 | | 2/2016 | Muench et al. | |
| 2002/0140498 A1 | * | 10/2002 | Pernici | G05F 3/30 |
| | | | | 327/540 |
| 2003/0006746 A1 | * | 1/2003 | Nishimura | G05F 3/262 |
| | | | | 323/313 |
| 2003/0197546 A1 | * | 10/2003 | Sim | G11O 5/147 |
| | | | | 327/534 |
| 2004/0207380 A1 | * | 10/2004 | Ariki | G05F 3/262 |
| | | | | 323/313 |
| 2007/0046364 A1 | * | 3/2007 | Yokoo | G05F 3/262 |
| | | | | 327/539 |
| 2007/0152649 A1 | * | 7/2007 | Liu | G05F 3/267 |
| | | | | 323/315 |
| 2009/0033311 A1 | * | 2/2009 | Sperling | G05F 3/262 |
| | | | | 323/316 |
| 2009/0184752 A1 | * | 7/2009 | Kudo | G05F 3/26 |
| | | | | 327/535 |
| 2010/0289464 A1 | * | 11/2010 | Yamamoto | G05F 1/575 |
| | | | | 323/280 |
| 2010/0327846 A1 | * | 12/2010 | Okamoto | H03H 11/245 |
| | | | | 323/369 |
| 2016/0126831 A1 | | 5/2016 | Fowers et al. | |
| 2016/0181913 A1 | | 6/2016 | Feng et al. | |

\* cited by examiner

US 9,964,975 B1

SEMICONDUCTOR DEVICES FOR SENSING VOLTAGES

BACKGROUND

Field

This disclosure relates generally to semiconductor devices, and more specifically, to sensing voltages for circuits with reverse back biasing.

Related Art

As semiconductor devices continue to decrease in size while continuing to increase in processing capability and portability, it is desirable to conserve power wherever possible while still providing fast response. Reverse back biasing (RBB) is one technique that can be used to bias threshold voltage and prevent leakage in circuit components such as transistors. One drawback with RBB is that the size of resistors and capacitors and the number of switches traditionally used to implement RBB circuitry is very large and consumes quite a bit of power. For example, negative charge pump feedback/sensing circuits using RBB require calibration circuitry and reference voltage or current, which increases area and complexity. Further, additional operational transconductance amplifiers and calibration time as well as level shifters supplied by positive and negative rails are used, increasing area and power consumption of the final devices.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Embodiments of devices and methods disclosed herein include regulated charge pumps to support reverse back biasing (RBB) that can be used in ultra-low power circuits. Sense circuitry can be used to regulate a charge pump by providing feedback voltage. Back bias voltages are sensed with respect to the supply rails. In addition, the sense circuitry can be used to test the back-bias voltages in production. The sense circuitry is suitable for low power applications where minimizing current consumption is important. Calibration is not required for the sense circuitry because the feedback path does not require a reference current or voltage. Moreover, there are no switches to control in the feedback path, reducing complexity.

Figure 1:
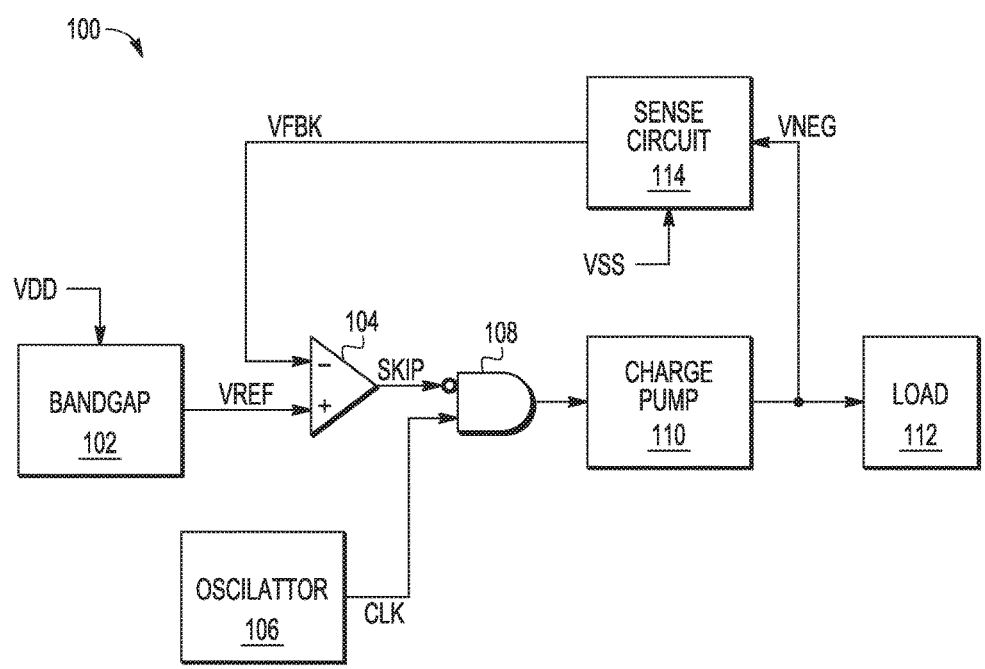
FIG. 1 illustrates a block diagram of an embodiment of a semiconductor device for a reverse back biasing generator in accordance with the present invention.

FIG. 1 illustrates a block diagram of an embodiment of a semiconductor device 100 for a reverse back biasing generator in accordance with the present invention that includes bandgap circuitry 102, comparator 104, clock oscillator 106, logic gate 108, charge pump 110, load 112 and sense circuit 114. Bandgap circuit 102 is coupled to supply voltage VDD and is configured to supply a reference voltage VREF to a non-negating input of comparator 104. Sense circuit 114 provides a feedback voltage signal VFBK to a negating input of comparator 104. Output of comparator 104 is provided to a first input of logic gate 108, which is implemented as an AND gate in the example shown. Another input of logic gate 108 is coupled to receive the clock signal CLK from oscillator 106. Output from logic gate 108 is provided to charge pump 110, and output from charge pump (VNEG) 110 is provided to load 112, and to sense circuit 114. Sense circuit 114 is also coupled to supply voltage VSS.

Semiconductor device 100 provides a regulated charge pump that can support RBB in Ultra-Thin Body and Buried Oxide (UTBB) Fully Depleted Silicon-On-Insulator (FD-SOI) technology. RBB is applied to reduce the sub-threshold currents via body effect. The strong body bias effect in UTBB FDSOI enables low-power and high-speed circuits. Semiconductor device 100 overcomes a 300 mV range limitation of conventional bulk technologies and enables RBB up to 3V in devices with conventional wells in which back gates of PMOS and NMOS transistors are N-Well and P-Well regions, respectively. RBB can be used to maximize the battery lifetime but it may be applied to compensate for die-to-die and within-die process variations.

Figure 2:
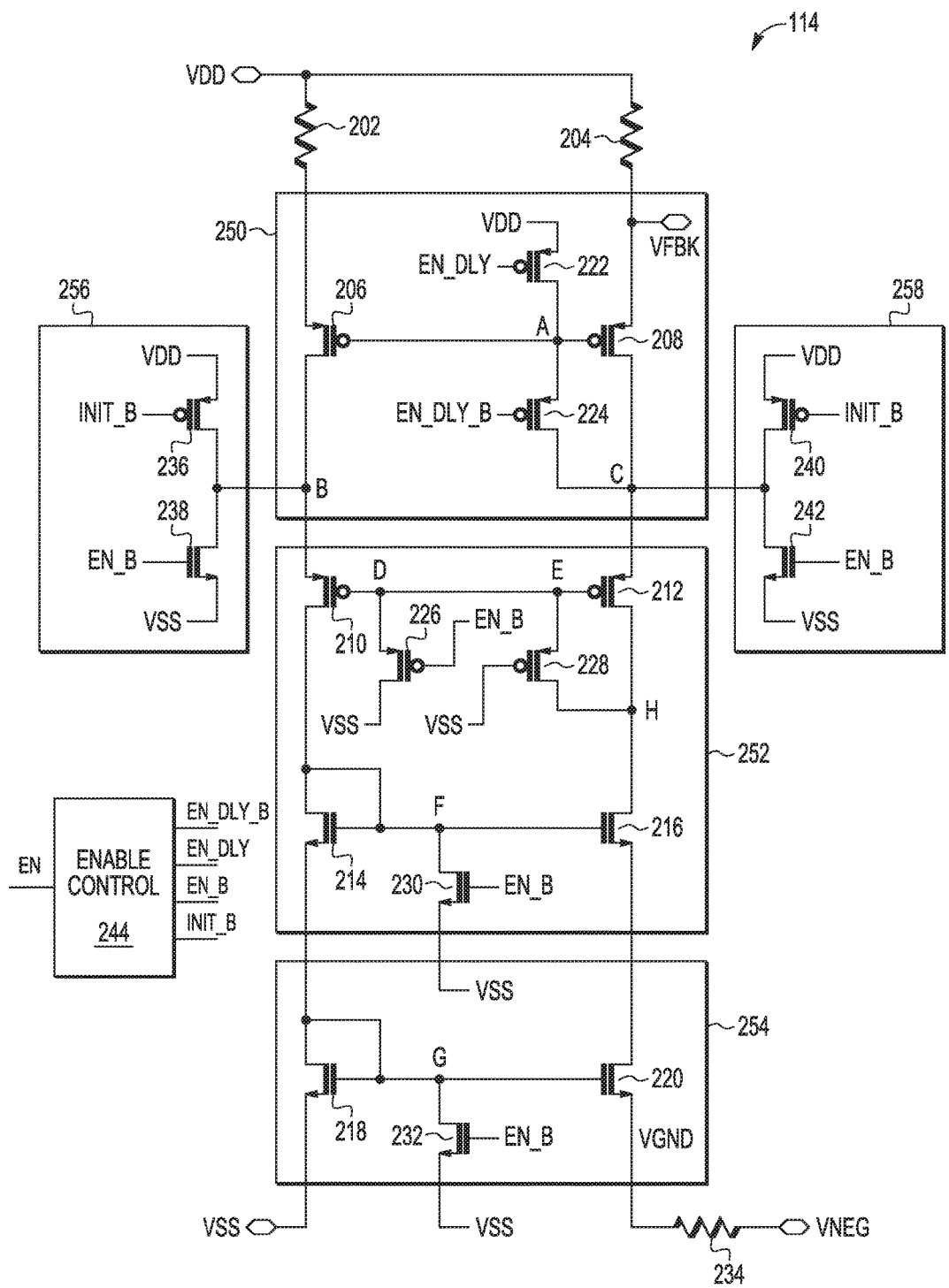
FIG. 2 illustrates a schematic diagram of an embodiment of a sensing circuit that can be used in the semiconductor device of FIG. 1.

FIG. 2 illustrates a schematic diagram of an embodiment of sense circuit 114 that can be used in the semiconductor device 100 of FIG. 1 including cascode circuit 252 coupled between current mirrors 250, 254, resistors 202, 204, 234, startup/shutdown circuits 256, 258, and switches 222, 224, 230, 232. Resistor 202 includes a first terminal coupled to supply voltage VDD and a second terminal coupled to current mirror 250. Resistor 204 includes a first terminal coupled to supply voltage VDD and the first terminal of resistor 202, and a second terminal coupled to current mirror 250. Note that resistors 202, 204 and 234 may be replaced by transistors or a series arrangement of transistors and resistors.

Current mirror 250 includes PMOS transistors 206, 208. PMOS transistor 206 includes a source electrode coupled to the second terminal of resistor 202, a gate electrode coupled to node A, and a drain electrode coupled to node B. PMOS transistor 208 includes a source electrode coupled to the second terminal of resistor 204, a gate electrode coupled to node A, and a drain electrode coupled to node C.

Switch 222 is a PMOS transistor that includes a source electrode coupled to supply voltage VDD, a gate electrode coupled to an enable delay signal (EN_DLY) and a drain electrode coupled to node A. Switch 224 is a PMOS transistor that includes a source electrode coupled to node A, a gate electrode coupled to a complement of the enable delay signal (EN_DLY_B), and a drain electrode coupled to node C. Switches 222, 224 are used to turn off transistors 206 and 208 when sense circuit 114 is disabled.

Startup/shutdown circuit 256 includes PMOS transistor 236 coupled to NMOS transistor 238. PMOS transistor 236 includes a source electrode coupled to supply voltage VDD, a gate electrode coupled to a complement of an initialization signal (INIT_B), and a drain electrode coupled to a drain electrode of NMOS transistor 238. NMOS transistor 238 further includes a gate electrode coupled to a complement of an enable signal (EN_B) and a source electrode coupled to supply voltage VSS, which can be ground or other voltage that is negative with respect to supply voltage VDD. The output of startup circuit 256 is coupled to node B between the drain electrode of PMOS transistor 236 and the drain electrode of NMOS transistor 238.

When sensing circuit 114 is disabled, transistors 238, 242 and 226 tie nodes B, C and D to VSS in order to protect transistors 212 and 228 against high-voltages between their electrodes. In this case, the maximum voltage between two electrodes is VSS-VNEG. The minimum value of VNEG is designed to keep transistors 212 and 228 in a safe operation range where they will not be damaged.

Startup/shutdown circuit 258 includes PMOS transistor 240 coupled to NMOS transistor 242. PMOS transistor 240 includes a source electrode coupled to supply voltage VDD, a gate electrode coupled to a complement of an initialization signal (INIT_B), and a drain electrode coupled to a drain electrode of NMOS transistor 242. NMOS transistor 242 further includes a gate electrode coupled to a complement of an enable signal (EN_B) and a source electrode coupled to supply voltage VSS, which can be ground or other voltage that is negative with respect to supply voltage VDD. The output of startup circuit 258 is coupled to node C between the drain electrode of PMOS transistor 240 and the drain electrode of NMOS transistor 242.

When sense circuit 114 is enabled, nodes B and C are pre-charged to VDD via transistors 236 and 240 and then released. As the currents do not need to flow initially through resistors 202 and 204, the start-up time (time to the output be close to its final value) is significantly improved while keeping transistors 236 and 240 in a safe range of operation that avoids high voltage between their electrodes.

Cascode circuit 252 includes PMOS transistors 210, 228, 212 and NMOS transistors 214, 216, 226. PMOS transistor 210 includes a source electrode coupled to node B, a gate electrode coupled to node D, and a drain electrode coupled to a drain electrode of NMOS transistor 214. NMOS transistor 214 further includes a gate electrode coupled to node F and to the drain electrode of NMOS transistor 214, and a source electrode coupled to current mirror 254. PMOS transistor 212 includes a source electrode coupled to node C, a gate electrode coupled to node E, and a drain electrode coupled to node H. NMOS transistor 216 includes a drain electrode coupled to node H, a gate electrode coupled to node F, and a source electrode coupled to current mirror 254. NMOS transistor 226 includes a drain electrode coupled to node D, a gate electrode coupled to the complement of the enable signal, and a drain electrode coupled to supply voltage VSS. PMOS transistor 228 includes a source electrode coupled to node E, a gate electrode coupled to supply voltage VSS, and a drain electrode coupled to node H. Nodes D and E are coupled to one another.

Current mirror 254 includes NMOS transistors 218, 220. NMOS transistor 218 includes a drain electrode coupled to the source electrode of transistor 214, a gate electrode coupled to node G and to the drain electrode of transistor 218, and a source electrode coupled to supply voltage VSS. NMOS transistor 220 includes a drain electrode coupled to the source electrode of transistor 216, a gate electrode coupled to node G, and a source electrode coupled to a first terminal of resistor 234. A second terminal of resistor 234 is coupled to negative voltage supply VNEG.

NMOS transistors 230 and 232 are included to increase the speed of starting up and shutting down sense circuit 114. NMOS transistor 230 includes a drain electrode coupled to node F, a gate electrode coupled to the complement of the enable signal (EN_B) and a source electrode coupled to supply voltage VSS. NMOS transistor 232 includes a drain electrode coupled to node G, a gate electrode coupled to the complement of the enable signal (EN_B) and a source electrode coupled to supply voltage VSS.

Figure 3:
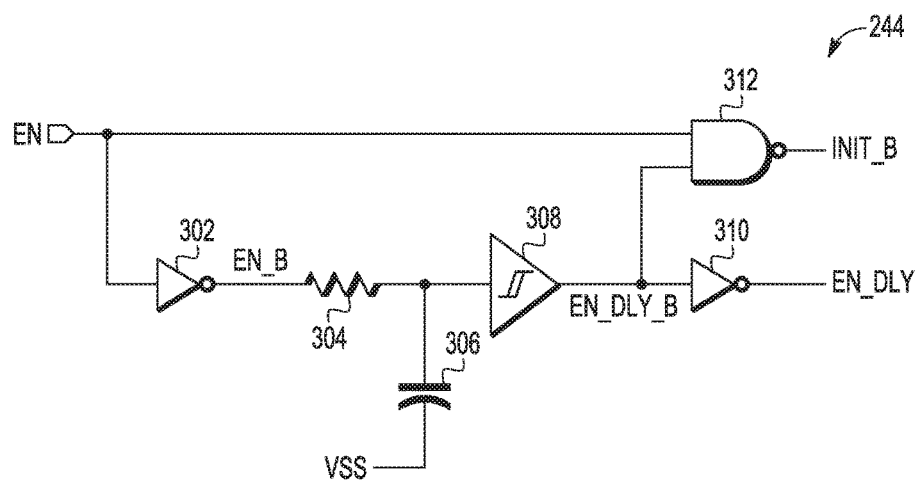
FIG. 3 illustrates a schematic diagram of an enable control circuit that can be used with the sensing circuit of FIG. 2.

Enable control circuit 244 receives an enable signal (EN) as an input and outputs the enable delay signal (EN_DLY), the complement of enable delay signal (EN_DLY_B), the complement of the enable signal (EN_B), and the complement of the initialization signal (INIT_B). FIG. 3 illustrates a schematic diagram of enable control circuit 244 that can be used with sensing circuit 114 of FIG. 2 that includes inverters 302, 310, resistor 304, capacitor 306, comparator 308, and NAND gate 312. Enable signal (EN) is provided as an input to inverter 302 and NAND gate 312. The output of inverter 302 is the complement of the enable signal (EN_B) and is coupled to a first terminal of resistor 304. A second terminal of resistor 304 is coupled to node I. A first terminal of capacitor is coupled to node I, and a second terminal of capacitor 306 is coupled to supply voltage VSS. An input of comparator 308 is coupled to node I. In some embodiments, comparator 308 may be implemented using a Schmitt trigger or other suitable circuitry. The output of comparator 308 is the complement of the enable delay signal (EN_DLY_B) and is provided as input to inverter 310 and NAND gate 312. The output of inverter 310 is the enable delay signal (EN_DLY) and the output of NAND gate is the complement of the initialization signal (INIT_B). The complement of the enable signal (EN_B) and the enable delay signal (EN_DLY) are the inverted and the delayed versions of the enable signal (EN), respectively. When enable control signal circuit 244 is enabled, an active low pulse is generated on the complement of the initialization signal (INIT_B). The active low pulse improves turn-on time and protects low power devices in sense circuit 114 that usually cannot tolerate high voltage between their terminals.

Referring again to FIG. 2, sense circuit 114 is able to sense a negative voltage VNEG with respect to the supply voltage VSS through current mirror 254 and resistor 234. The feedback loop between VNEG and VFBK creates a virtual ground node VGND. The voltage difference VSS minus VNEG is converted to a current, which is converted back to a positive voltage difference as VDD minus VFBK.

Figure 4:
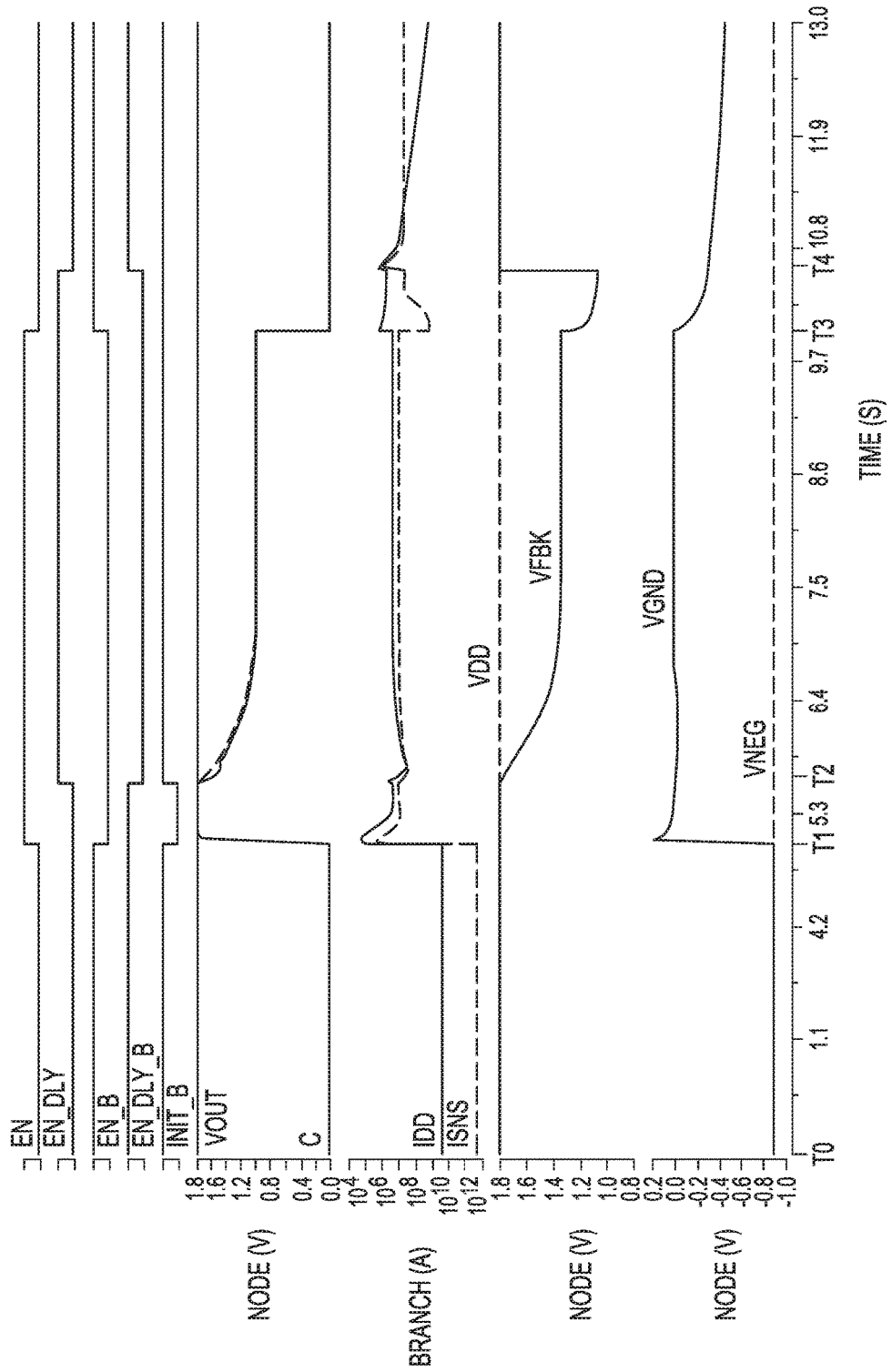
FIG. 4 illustrates an example timing diagrams for various signals in the sensing circuit of FIG. 2 during power up, normal operation, and power down modes.

Referring to FIGS. 2 and 4, FIG. 4 illustrates an example timing diagrams for various signals in the sensing circuit of FIG. 2 during power up, normal operation, and power down modes. When the enable signal (EN) is not asserted from time T0 to T1, sense circuit 114 is disabled. In this condition, the current consumption is nearly zero and the devices in sense circuit 114 are protected against high voltages between any pair of their terminals. Nodes A, E and F are pulled to ground and PMOS transistor 228 cuts off current flow. As no current flows through PMOS transistors 212 and 228, the voltage on node G is VNEG. PMOS transistors 212 and 228 will be in a safe operation region as long as the difference between supply voltage VSS and VNEG does not exceed the maximum voltage allowed between terminals.

When the enable signal (EN) is asserted at time T1, sense circuit 114 is enabled following a sequence of events. First, NMOS transistors 238 and 242 are turned off and PMOS transistors 236, 240 connect nodes B and C to supply voltage VDD. Sense circuit 114 is kept in this configuration during the duration of the active low pulse on the complement of initialization signal (INIT_B). In this configuration, the high resistive paths of PMOS transistor 206 and resistor 202, and PMOS transistor 208 and resistor 204 are eliminated improving the turn-on time and helping to protect sense circuit 114 against violations of safe operating region. At the end of the pulse on the INIT_B signal at time T2, PMOS transistors 236 and 240 are turned off and node A is connected to node C through PMOS transistor 224. FIG. 4 shows the total current drawn from VDD which is shown as IDD and the sense current ISNS, which can be optimized separately. In some embodiments, it may be desirable to keep ISNS as low as possible, but to increase IDD in order to reduce the area of the circuit. Resistor 204 is set according to the maximum ISNS requirement (ISNS=(VSS−RNEG)/Resistor 204).

The value of resistor 202 is selected to amplify the voltage difference sensed between VSS and VNEG, and may change dynamically according to the desired VNEG (VDD−VFBK=Resistor 202*ISNS). The value of resistor 234 can be set according to the maximum IDD requirement (IDD=(Resistor 202/Resistor 204+1)*ISNS).

When the enable signal is de-asserted at time T3, NMOS transistors 230, 232, 238, 242, 226 are non-conducting, causing voltage at node C, and voltages VGND and VFBK to decrease. Once the delay in the change in the enable signal is over at time T4, PMOS transistor 222 is placed in conducting mode and PMOS transistor 224 is in non-conducting mode, causing transistors 206 and 208 turn off and consequently VFBK to be equal to the supply voltage VDD due to the pull up resistor 204.

Sense circuit 114 receives a negative voltage VNEG and translates VNEG to a positive voltage VFBK that is between supply voltages VSS and VDD. For conventional wells, the back gate voltages are generated taking the respective source voltages as reference to support operation along with dynamic voltage scaling. Supply voltage VDD biases the PMOS back gate, and negative voltage VNEG biases the NMOS back gate. Sense circuit 114 enables low-power circuits to sense back-bias voltages with respect to supply voltages VSS and VDD.

Sense circuit 114 is thus capable of sensing voltages outside supply voltages VDD and VSS and is suitable for low power applications where current consumption is critical (e.g., less than 0.2 µA). Sense circuit 114 can also be used to test the back-bias voltages in production, to sense the voltage difference between an input node and voltage reference, to attenuate glitches and bounces that could otherwise damage nearby circuits during initialization, and to reduce startup and shutdown time of semiconductor device 100.

Figure 5:
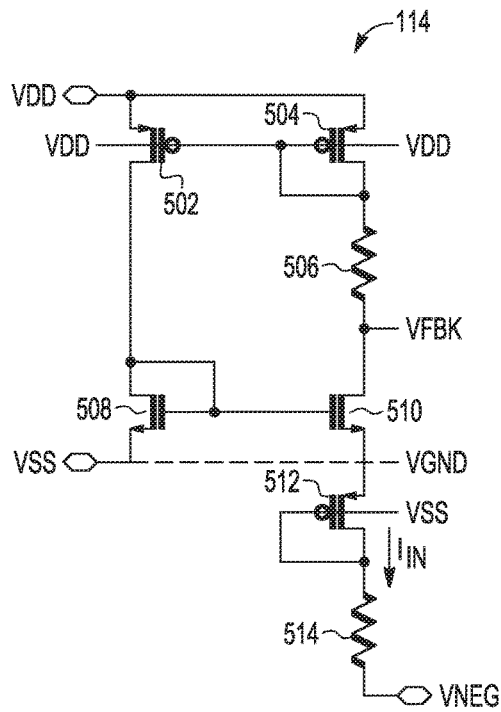
FIG. 5 illustrates a schematic diagram of another embodiment of a sensing circuit that can be used in the semiconductor device of FIG. 1.

FIG. 5 illustrates a schematic diagram of another embodiment of sensing circuit 100 that can be used in the semiconductor device 100 of FIG. 1 including current mirror 500 with PMOS transistors 502, 504, resistor 506, a second current mirror with NMOS transistors 508, 510, PMOS transistor 512, and resistor 514. PMOS transistor 502 includes a source electrode coupled to supply voltage VDD, a gate electrode coupled to VDD and a gate electrode of PMOS transistor 504, and a drain electrode coupled to a drain electrode of NMOS transistor 508. PMOS transistor 504 includes a source electrode coupled to supply voltage VDD and the source electrode of PMOS transistor 502, a gate electrode coupled to VDD and the gate electrode of PMOS transistor 502, and a drain electrode coupled to a first terminal of resistor 506 and to the gate electrodes of PMOS transistors 502 and 504. Resistor 506 includes a second terminal coupled to a drain electrode of NMOS transistor 510. NMOS transistor 508 includes a drain electrode coupled to the drain electrode of PMOS transistor 502, a gate electrode coupled to the drain electrode of NMOS transistor 508, and a source electrode coupled to supply voltage VSS. NMOS transistor 510 further includes a gate electrode coupled to the gate and drain electrodes of NMOS transistor 508, and a source electrode coupled to a source electrode of PMOS transistor 512. PMOS transistor 512 further includes a drain electrode coupled to a first terminal of resistor 514 and a gate electrode coupled to the drain electrode of PMOS transistor 512 and to supply voltage VSS. Resistor 514 further includes a second terminal coupled to negative voltage source VNEG output by charge pump 110 (FIG. 1). Sense circuit 114 senses a negative voltage source VNEG with respect to the supply voltage VSS through current mirror 508/510 and resistor 514. The feedback loop between VNEG and VFBK creates a virtual ground node VGND. The voltage difference VSS minus VNEG is converted to a current IIN, which is converted back to a positive voltage difference as VDD minus VFBK. IIN is converted back to a voltage difference as VDD−VOUT. If the transistors 502, 504 and resistors 506 and 514 match each other, the voltage difference VDD−VFBK is equal to VSS−VNEG. In this topology, the input voltage VNEG is generally lower than a threshold voltage (VTH) to keep sense circuit 114 in a safe operating condition.

Figure 6:
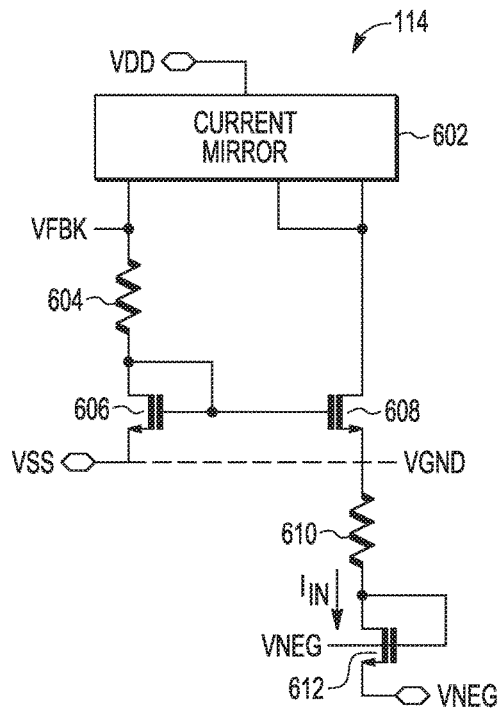
FIG. 6 illustrates a schematic diagram of another embodiment of a sensing circuit that can be used in the semiconductor device of FIG. 1.

FIG. 6 illustrates a schematic diagram of another embodiment of sensing circuit 114 that can be used in the semiconductor device 100 of FIG. 1 including current mirror 600, resistor 604, NMOS transistors 606, 608, resistor 610, and NMOS transistor 612. Current mirror 600 can be implemented with two PMOS transistors as shown for current mirror 500 in FIG. 5. Resistor 604 includes a first terminal coupled to current mirror 604 (e.g., to a drain of PMOS transistor 502 with a current mirror similar to current mirror 500 shown in FIG. 5) and a second terminal coupled to a drain electrode of NMOS transistor 606. NMOS transistor 606 further includes a source electrode coupled to supply voltage VSS and a gate electrode coupled to the drain electrode of NMOS transistor 606 and a gate electrode of NMOS transistor 608. NMOS transistor 608 further includes a drain electrode coupled to a first terminal of resistor 610 and a gate electrode coupled to the gate electrode of NMOS transistor 606. Resistor 610 further includes a second terminal coupled to a drain electrode of NMOS transistor 612. NMOS transistor 612 further includes a gate electrode coupled to the drain electrode of NMOS transistor 612 and to negative voltage source VNEG provided by charge pump 110 (FIG. 1), and a source electrode coupled to negative voltage source VNEG. As with sense circuit 114 of FIGS. 2 and 5, sense circuit 114 of FIG. 6 senses a negative voltage source VNEG with respect to the supply voltage VSS through current mirror 606/608 and resistor 610. The feedback loop between VNEG and VFBK creates a virtual ground node VGND. The voltage difference VSS minus VNEG is converted to a current IIN, which is converted back to a positive voltage difference as VDD minus VFBK. Sense circuit 114 of FIG. 6 generates VFBK with respect to VSS, which may be more convenient in some circumstances. With transistors in current mirror 600 and resistors 604 and 610 matching each other, VFBK−VSS is equal to VSS–VNEG. Compared to sense circuit 114 of FIG. 5, current mirror 600 adds an additional error on the feedback voltage VFBK. Regarding the input voltage range, VNEG should be lower than a threshold voltage VTH.

Figure 7:
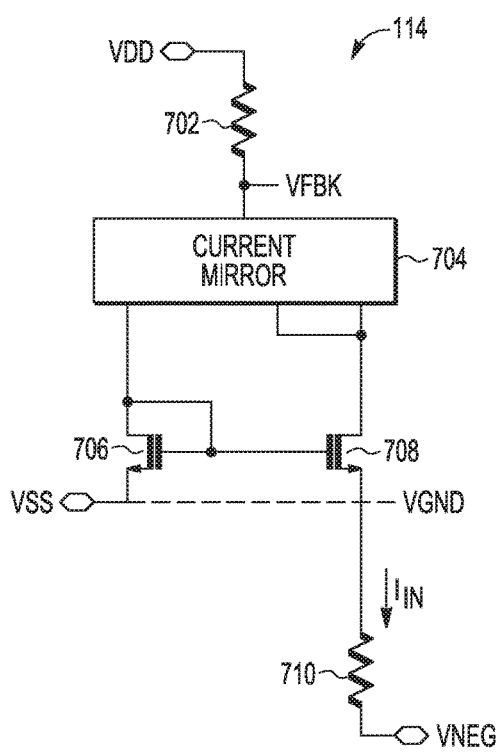
FIG. 7 illustrates a schematic diagram of another embodiment of a sensing circuit that can be used in the semiconductor device of FIG. 1.

FIG. 7 illustrates a schematic diagram of another embodiment of sensing circuit 114 that can be used in the semiconductor device 100 of FIG. 1 including current mirror 704, resistor 702, NMOS transistors 706, 708, and resistor 710. Current mirror 704 can be implemented with two PMOS transistors as shown for current mirror 500 in FIG. 5. Resistor 702 includes a first terminal coupled to supply voltage VDD and a second terminal coupled to current mirror 704 (e.g., to a source of PMOS transistor 502 with a current mirror similar to current mirror 500 shown in FIG. 5). NMOS transistor 706 includes a drain electrode coupled to current mirror 704 (e.g., to a drain electrode of PMOS transistor 502 with a current mirror similar to current mirror 500 shown in FIG. 5), a source electrode coupled to supply voltage VSS and a gate electrode coupled to the drain electrode of NMOS transistor 706 and a gate electrode of NMOS transistor 708. NMOS transistor 708 further includes a drain electrode coupled to current mirror 704 (e.g., to a drain electrode of PMOS transistor 504 with a current mirror similar to current mirror 500 shown in FIG. 5), a gate electrode coupled to the gate electrode of NMOS transistor 706, and a source electrode coupled to a first terminal of resistor 710. Resistor 710 further includes a second terminal coupled to negative voltage source VNEG. Sense circuit 114 of FIG. 7 extends the range of the negative voltage source VNEG, making it possible to sense a voltage difference VSS–VNEG less than threshold voltage VTH.

Compared to sense circuits 114 of FIGS. 2, 5 and 6, larger resistors 702, 710 would be required than the resistors 202/234, 506/514, 604/610 (FIGS. 2, 5 and 6) to keep the same power consumption. The voltage difference VDD minus VFBK is equal to twice the value of resistor 702 divided by the value of resistor 710, times VSS minus VNEG.

Figure 8:
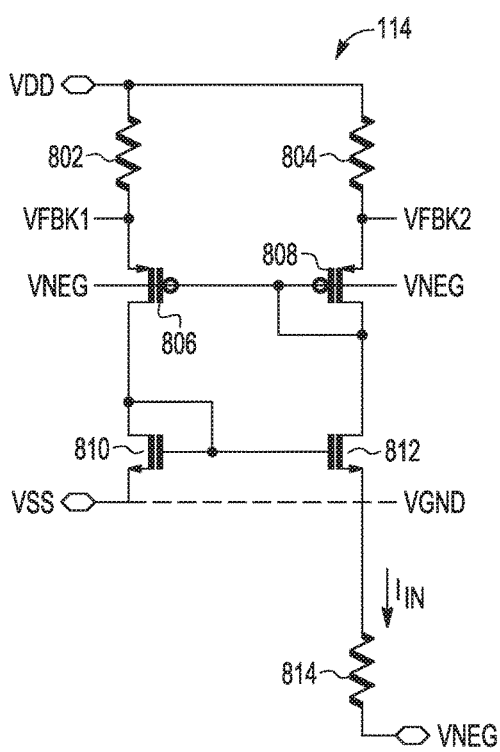
FIG. 8 illustrates a schematic diagram of another embodiment of a sensing circuit that can be used in the semiconductor device of FIG. 1.

FIG. 8 illustrates a schematic diagram of another embodiment of sensing circuit 114 that can be used in semiconductor device 100 of FIG. 1 that includes resistors 802, 804, 814, a first current mirror 816 with PMOS transistors 806, 808, and a second current mirror 818 with NMOS transistors 810, 812. Resistor 802 includes a first terminal coupled to supply voltage VDD and a second terminal coupled to a source electrode of PMOS transistor 806. PMOS transistor 806 further includes a gate electrode coupled to negative voltage source VNEG and to gate and drain electrodes of PMOS transistor 808, and a drain electrode coupled to a drain electrode of NMOS transistor 810. NMOS transistor 810 further includes a source electrode coupled to supply voltage VSS and a gate electrode coupled to the drain electrode of NMOS transistor 810 and to the gate electrode of NMOS transistor 812. Resistor 804 includes a first terminal coupled to supply voltage VDD and the first terminal of resistor 802, and a second terminal coupled to a source electrode of PMOS transistor 808. PMOS transistor 808 further includes a gate electrode coupled to negative voltage source VNEG and to the gate electrode of PMOS transistor 806, and a drain electrode coupled to a drain electrode of NMOS transistor 812 and the gate electrode of PMOS transistor 808. NMOS transistor 812 further includes a source electrode coupled to a first terminal of resistor 814 and a gate electrode coupled to the drain and gate electrodes of NMOS transistor 810. Resistor 814 further includes a second terminal coupled to negative voltage source VNEG. Sensing circuit 114 of FIG. 8 uses a source-degenerated current mirror (PMOS transistors 806/808 with resistors 802, 804) to reduce error due to current mirror 816. The output voltage may be taken from VFBK-1 or VFBK-2. The voltage difference VDD minus VFBK equals resistor 804 divided by resistor 814, times VSS minus VNEG.

Figure 9:
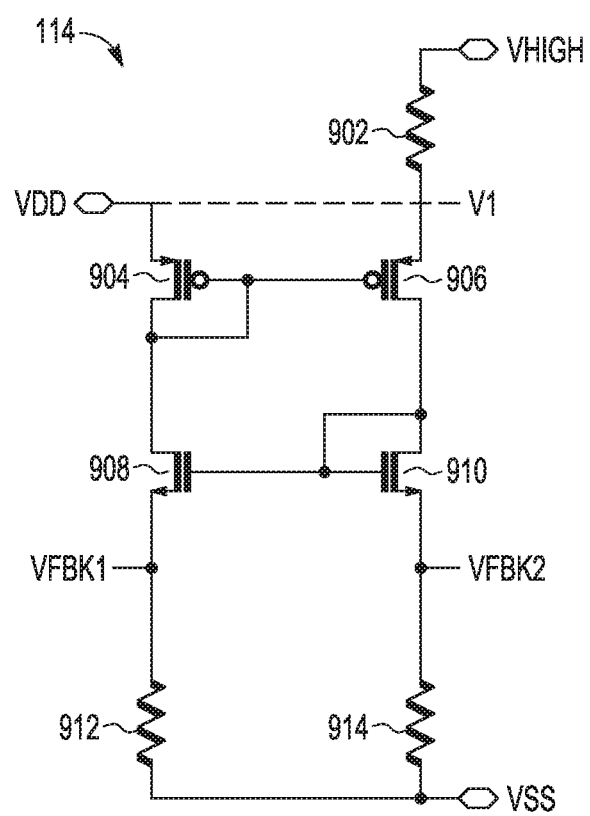
FIG. 9 illustrates a schematic diagram of another embodiment of a sensing circuit that can be used in the semiconductor device of FIG. 1.

FIG. 9 illustrates a schematic diagram of another embodiment of sensing circuit 114 that can be used in semiconductor device 100 of FIG. 1 that includes resistors 902, 912, 914, PMOS transistors 904, 906, and NMOS transistors 908, 910. Resistor 902 includes a first terminal coupled to a high supply voltage VHIGH and a second terminal coupled to a source electrode of PMOS transistor 906. PMOS transistor 906 further includes a gate electrode coupled to a gate and drain electrodes of PMOS transistor 904, and a drain electrode coupled to gate and drain electrodes of NMOS transistor 910. NMOS transistor 910 further includes a gate electrode coupled to the drain electrode of NMOS transistor 910 and a gate electrode of NMOS transistor 908, and a source electrode coupled to a first terminal of resistor 914. Resistor 914 further includes a second terminal coupled to supply voltage VSS. PMOS transistor 904 includes a source electrode coupled to supply voltage VDD, a gate electrode coupled to the gate electrode of PMOS transistor 906 and the drain electrode of PMOS transistor 904, and a drain electrode coupled to a drain electrode of NMOS transistor 908. NMOS transistor 908 further includes a gate electrode coupled to the gate and drain electrodes of NMOS transistor 910, and a source electrode coupled to a first terminal of resistor 912. Resistor 912 further includes a second terminal coupled to supply voltage VSS and the second terminal of resistor 914. Sense circuit 114 of FIG. 9 is able to sense a high voltage VHIGH with respect to the supply voltage VDD. A feedback loop is used to copy VDD at node V1. Source-degenerated current mirror 916 with NMOS transistors 908, 910 and resistors 912, 914 is used to reduce errors due to NMOS transistors 908, 910 and to convert the sensed current ISNS ((VHIGH–VDD)/Resistor 902) to a voltage difference (VFBK–VSS). The output voltage may be taken from VFBK-1 or VFBK-2. The voltage difference VFBK minus VSS equals resistor 914 divided by resistor 902 times VHIGH minus VDD.

By now it should be appreciated that in selected embodiments there has been provided embodiments of sense circuit 114 capable of sensing voltages outside power supply rails that are suitable for low power applications where current consumption is critical (e.g., less than 0.2 µA). Sense circuit 114 provide feedback voltage to a voltage regulator 100 with charge pump 110, and converts the input signal from a negative voltage output by charge pump 110 to a positive voltage. Sense circuit 114 also provide the means to test back bias voltages in production, the ability to sense the voltage difference between an input node and a voltage reference, improves initialization with signal conditioning that attenuates bounces and spikes in input signals that can easily damage nearby circuits, and improves startup time.

In some embodiments, a circuit for converting a negative voltage to a positive proportional voltage can comprise a first power supply terminal (Vdd), a second power supply terminal (Vss), an input node coupled to receive the negative voltage, an output node coupled to provide the positive proportional voltage, a first resistive element (234) having a first terminal coupled to the input node, a second resistive element (202) having a first terminal coupled to the first power supply terminal, a third resistive element (204) having a first terminal coupled to the first power supply terminal, a first current mirror having a first transistor (206) having a first current electrode coupled to a second terminal of the second resistive element, and a second transistor (208) having a first current electrode coupled to a second terminal of the third resistive element and a control electrode coupled to a control electrode of the first transistor and a second current electrode of the second transistor. The output node corresponds to the second terminal of the third resistive element. A second current mirror can have a third transistor (218) having a first current electrode coupled to a second current electrode of the first transistor, a control electrode coupled to the first current electrode of the third transistor, and a second current electrode coupled to the second power supply terminal, and a fourth transistor (220) having a first current electrode coupled to a second current electrode of the second transistor, a control electrode coupled to the control electrode of the third transistor, and a second current electrode coupled to a second terminal of the first resistive element.

In another aspect, the circuit can further comprise cascoded transistors coupled between the second current electrode of the first and second transistor and the first current electrode of the third and fourth transistors.

In another aspect, the cascoded transistors can comprise a first pair of cascode transistors connected in series with a second pair of cascode transistors to provide impedance matching.

In another aspect, the positive proportional voltage can be proportional to the difference between the negative voltage and a ground voltage at the second power supply terminal.

In another aspect, the circuit can further comprise enable circuitry configured to enable the circuit for normal operation.

In another aspect, the enable circuitry can be configured to, upon enabling the circuit to enter normal operation, enable the second current mirror prior to enabling the first current mirror.

In another aspect, the enable circuitry can be configured to assert an enable signal (en_b=0) to enable the second current mirror and configured to assert a delayed enable signal (enb_dly_b=0) based on the enable signal to enable the first current mirror.

In another aspect, the enable circuitry can be configured to connect the control electrode of the second transistor to the first supply voltage terminal to disable the first current mirror and to connect the control electrode of the third transistor to the second supply voltage terminal to disable the second current mirror.

In another aspect, the circuit can further comprise initialization circuitry wherein the initialization circuitry is configured to couple the second current electrode of the first transistor to the first supply voltage terminal and the second current electrode of the second transistor to the first supply voltage terminal for an initialization time period (init_b=0) between enabling the second current mirror and the first current mirror.

In another aspect, the initialization circuitry can be configured to decouple the second current electrode of the first transistor from the first supply voltage terminal and decouple the second current electrode of the second transistor from the first supply voltage terminal outside the initialization time period.

In another aspect, the circuit can further comprise a negative charge pump coupled to provide the negative voltage to the input node, a comparator coupled to receive the positive proportional voltage and a reference voltage, and a logic circuit coupled to receive an output of the comparator and a clock signal, and coupled to provide a control signal to the negative charge pump in response to the output of the comparator and clock signal.

In another aspect, the first and the second resistive elements can each have a resistive value in a range of hundreds of kilo Ohms.

In other embodiments, a circuit for converting a negative voltage to a positive proportional voltage can comprise a first power supply terminal (Vdd); a second power supply terminal (Vss); an input node coupled to receive the negative voltage; an output node coupled to provide the positive proportional voltage; a first resistive element (514, 610); a first current mirror having a first transistor (502, inside 602) with a first current electrode coupled to the first power supply terminal, and a second transistor (504, inside 602) having a first current electrode coupled to the first power supply node and a control electrode coupled to a control electrode of the first transistor and a second current electrode of the second transistor. A second current mirror can have a third transistor (508, 606) having a first current electrode coupled to a second current electrode of the first transistor, a control electrode coupled to the first current electrode of the third transistor, and a second current electrode coupled to the second power supply terminal, and a fourth transistor (510, 608) having a first current electrode coupled to a second current electrode of the second transistor, a control electrode coupled to the control electrode of the third transistor, and a second current electrode coupled to a first terminal of the first resistive element, and an element selected from a group consisting of a second resistive element coupled between the second current electrode of the second transistor and the first current electrode of the fourth transistor, and a third resistive element coupled between the second current electrode of the first transistor and the first current electrode of the third transistor.

In another aspect, the circuit can comprise the second resistive element, and the output node corresponds to the first current electrode of the fourth transistor.

In another aspect, the circuit can comprise the third resistive element, and the output node corresponds to the second current electrode of the first transistor.

In another aspect, the positive proportional voltage can be proportional to the difference between the negative voltage and a ground voltage at the second power supply terminal.

In another aspect, the element can have a resistance value in a range of hundreds of kilo Ohms.

In still further embodiments, a circuit for converting a negative voltage to a positive proportional voltage can comprise a first power supply terminal (Vdd); a second power supply terminal (Vss); an input node coupled to receive the negative voltage; an output node coupled to provide the positive proportional voltage; a first resistive element (710); a second resistive element (702) having a first terminal coupled to the first power supply terminal, the output node corresponds to the second terminal of the second resistive element. A first current mirror can have a first transistor (in 704) with a first current electrode coupled to a second terminal of the second resistive element, and a second transistor (in 704) with a first current electrode coupled to the second terminal of the second resistive element and a control electrode coupled to a control electrode of the first transistor and a second current electrode of the second transistor. A second current mirror can have a third transistor (706) with a first current electrode coupled to a second current electrode of the first transistor, a control electrode coupled to the first current electrode of the third transistor, and a second current electrode coupled to the second power supply terminal, and a fourth transistor (710)

having a first current electrode coupled to a second current electrode of the second transistor, a control electrode coupled to the control electrode of the third transistor, and a second current electrode coupled to a first terminal of the first resistive element.

In another aspect, the positive proportional voltage can be proportional to the difference between the negative voltage and a ground voltage at the second power supply terminal.

In another aspect, the first resistive element can have a resistance value in a range of hundreds of kilo Ohms and the second resistive element can have a resistance value in a range of hundreds of kilo Ohms.

Because the apparatus implementing the present disclosure is, for the most part, composed of electronic components and circuits known to those skilled in the art, circuit details will not be explained in any greater extent than that considered necessary as illustrated above, for the understanding and appreciation of the underlying concepts of the present disclosure and in order not to obfuscate or distract from the teachings of the present disclosure.

Although the disclosure is described herein with reference to specific embodiments, various modifications and changes can be made without departing from the scope of the present disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to specific embodiments are not intended to be construed as a critical, required, or essential feature or element of any or all the claims.

The term "coupled," as used herein, is not intended to be limited to a direct coupling or a mechanical coupling.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to disclosures containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

What is claimed is:

1. A circuit for converting a negative voltage to a positive proportional voltage, the circuit comprising:
   a first power supply terminal;
   a second power supply terminal;
   an input node coupled to receive the negative voltage;
   an output node coupled to provide the positive proportional voltage;
   a first resistive element having a first terminal coupled to the input node;
   a second resistive element having a first terminal coupled to the first power supply terminal;
   a third resistive element having a first terminal coupled to the first power supply terminal;
   a first current mirror having:
      a first transistor having a first current electrode coupled to a second terminal of the second resistive element, and
      a second transistor having a first current electrode coupled to a second terminal of the third resistive element and a control electrode coupled to a control electrode of the first transistor and a second current electrode of the second transistor, wherein the output node corresponds to the second terminal of the third resistive element; and
   a second current mirror having:
      a third transistor having a first current electrode coupled to a second current electrode of the first transistor, a control electrode coupled to the first current electrode of the third transistor, and a second current electrode coupled to the second power supply terminal, and
      a fourth transistor having a first current electrode coupled to a second current electrode of the second transistor, a control electrode coupled to the control electrode of the third transistor, and a second current electrode coupled to a second terminal of the first resistive element.

2. The circuit of claim 1, further comprising:
   cascoded transistors coupled between the second current electrode of the first and second transistor and the first current electrode of the third and fourth transistors.

3. The circuit of claim 2, wherein the cascoded transistors comprise a first pair of cascode transistors connected in series with a second pair of cascode transistors to provide impedance matching.

4. The circuit of claim 1, wherein the positive proportional voltage is proportional to a difference between the negative voltage and a ground voltage at the second power supply terminal.

5. The circuit of claim 1, further comprising enable circuitry, wherein the enable circuitry is configured to enable the circuit for normal operation.

6. The circuit of claim 5, wherein the enable circuitry is configured to, upon enabling the circuit to enter normal operation, enable the second current mirror prior to enabling the first current mirror.

7. The circuit of claim 6, wherein the enable circuitry is configured to assert an enable signal to enable the second current mirror and configured to assert a delayed enable signal based on the enable signal to enable the first current mirror.

8. The circuit of claim 6, further comprising initialization circuitry wherein the initialization circuitry is configured to couple the second current electrode of the first transistor to the first supply voltage terminal and the second current electrode of the second transistor to the first supply voltage terminal for an initialization time period between enabling the second current mirror and the first current mirror.

9. The circuit of claim 8, wherein the initialization circuitry is configured to decouple the second current electrode of the first transistor from the first supply voltage terminal and decouple the second current electrode of the second transistor from the first supply voltage terminal outside the initialization time period.

10. The circuit of claim 5, wherein the enable circuitry is configured to connect the control electrode of the second transistor to the first supply voltage terminal to disable the first current mirror and to connect the control electrode of the third transistor to the second supply voltage terminal to disable the second current mirror.

11. The circuit of claim 1, further comprising:
a negative charge pump coupled to provide the negative voltage to the input node;
a comparator coupled to receive the positive proportional voltage and a reference voltage; and
a logic circuit coupled to receive an output of the comparator and a clock signal, and coupled to provide a control signal to the negative charge pump in response to the output of the comparator and the clock signal.

12. The circuit of claim 1, wherein the first and the second resistive elements each have a resistive value in a range of hundreds of kilo Ohms.

13. A circuit for converting a negative voltage to a positive proportional voltage, the circuit comprising:
a first power supply terminal;
a second power supply terminal;
an input node coupled to receive the negative voltage;
an output node coupled to provide the positive proportional voltage;
a first resistive element;
a first current mirror having:
a first transistor having a first current electrode coupled to the first power supply terminal, and
a second transistor having a first current electrode coupled to the first power supply node and a control electrode coupled to a control electrode of the first transistor and a second current electrode of the second transistor; and
a second current mirror having:
a third transistor having a first current electrode coupled to a second current electrode of the first transistor, a control electrode coupled to the first current electrode of the third transistor, and a second current electrode coupled to the second power supply terminal, and
a fourth transistor having a first current electrode coupled to a second current electrode of the second transistor, a control electrode coupled to the control electrode of the third transistor, and a second current electrode coupled to a first terminal of the first resistive element; and
an element selected from a group consisting of:
a second resistive element coupled between the second current electrode of the second transistor and the first current electrode of the fourth transistor, and
a third resistive element coupled between the second current electrode of the first transistor and the first current electrode of the third transistor.

14. The circuit of claim 13, wherein the circuit comprises the second resistive element, and the output node corresponds to the first current electrode of the fourth transistor.

15. The circuit of claim 13, wherein the circuit comprises the third resistive element, and the output node corresponds to the second current electrode of the first transistor.

16. The circuit of claim 13, wherein the positive proportional voltage is proportional to a difference between the negative voltage and a ground voltage at the second power supply terminal.

17. The circuit of claim 13, wherein the element has a resistance value in a range of hundreds of kilo Ohms.

18. A circuit for converting a negative voltage to a positive proportional voltage, the circuit comprising:
a first power supply terminal;
a second power supply terminal;
an input node coupled to receive the negative voltage;
an output node coupled to provide the positive proportional voltage;
a first resistive element;
a second resistive element having a first terminal coupled to the first power supply terminal, the output node corresponds to a second terminal of the second resistive element;
a first current mirror having:
a first transistor having a first current electrode coupled to the second terminal of the second resistive element, and
a second transistor having a first current electrode coupled to the second terminal of the second resistive element and a control electrode coupled to a control electrode of the first transistor and a second current electrode of the second transistor; and
a second current mirror having:
a third transistor having a first current electrode coupled to a second current electrode of the first transistor, a control electrode coupled to the first current electrode of the third transistor, and a second current electrode coupled to the second power supply terminal, and
a fourth transistor having a first current electrode coupled to the second current electrode of the second transistor, a control electrode coupled to the control electrode of the third transistor, and a second current electrode coupled to a first terminal of the first resistive element.

19. The circuit of claim 18, wherein the positive proportional voltage is proportional to a difference between the negative voltage and a ground voltage at the second power supply terminal.

20. The circuit of claim 18, wherein the first resistive element has a resistance value in a range of hundreds of kilo Ohms and the second resistive element has a resistance value in a range of hundreds of kilo Ohms.

* * * * *